(12) United States Patent
Seol et al.

(10) Patent No.: US 9,099,184 B2
(45) Date of Patent: Aug. 4, 2015

(54) MEMORY DEVICE AND METHOD OF READING DATA FROM MEMORY DEVICE USING ELEMENT GRAPHS

(75) Inventors: Chang-Kyu Seol, Osan-Si (KR); Jun-Jin Kong, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 347 days.

(21) Appl. No.: 13/607,987

(22) Filed: Sep. 10, 2012

(65) Prior Publication Data

US 2013/0094293 A1 Apr. 18, 2013

(30) Foreign Application Priority Data

Oct. 18, 2011 (KR) .................. 10-2011-0106634

(51) Int. Cl.
G11C 16/12 (2006.01)
G06F 11/10 (2006.01)
G11C 16/26 (2006.01)
G11C 16/34 (2006.01)

(52) U.S. Cl.
CPC .............. G11C 16/12 (2013.01); G06F 11/10 (2013.01); G11C 16/26 (2013.01); G11C 16/3422 (2013.01); G11C 16/3427 (2013.01)

(58) Field of Classification Search
CPC ...... H04L 1/0054; H04L 41/142; G11C 7/02; G11C 11/56; G11C 29/00; G11C 2029/0411; G11C 16/3418; G11C 29/02; G06F 11/1068; G06F 17/2715

USPC ............................................ 714/42, 773, 763
See application file for complete search history.

(56) References Cited

U.S. PATENT DOCUMENTS

| 7,751,237 | B2 | 7/2010 | Alrod et al. | |
|---|---|---|---|---|
| 2008/0151617 | A1 | 6/2008 | Alrod et al. | |
| 2009/0319868 | A1* | 12/2009 | Sharon et al. | 714/763 |
| 2011/0131473 | A1* | 6/2011 | Mokhlesi et al. | 714/773 |
| 2011/0167305 | A1* | 7/2011 | Haratsch et al. | 714/42 |

FOREIGN PATENT DOCUMENTS

KR 1020090020326 A 2/2009

* cited by examiner

*Primary Examiner* — Richard Elms
*Assistant Examiner* — Ajay Ojha
(74) *Attorney, Agent, or Firm* — Volentine & Whitt, PLLC

(57) ABSTRACT

Data is read from memory cells, including at least one victim cell and at least one aggressor cell, using an element graph. Reading the data includes defining function nodes corresponding to probability density functions with respect to a first physical characteristic of the at least one victim cell and a second physical characteristic of the at least one aggressor cell, defining variable nodes corresponding to at least one first data value stored in the at least one victim cell and at least one second data value stored in the at least one aggressor cell, and defining edges connecting the function nodes and the variable nodes.

14 Claims, 12 Drawing Sheets

FIG. 8
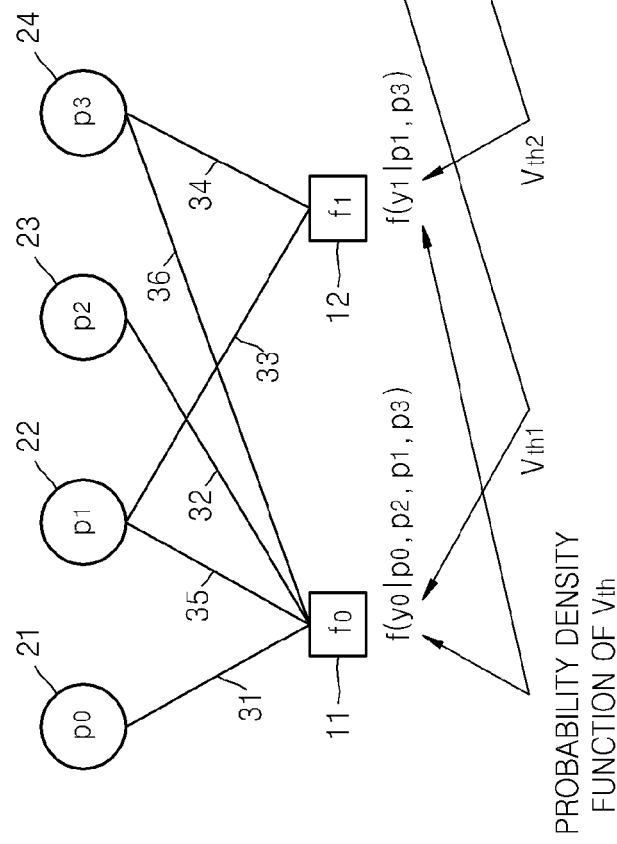
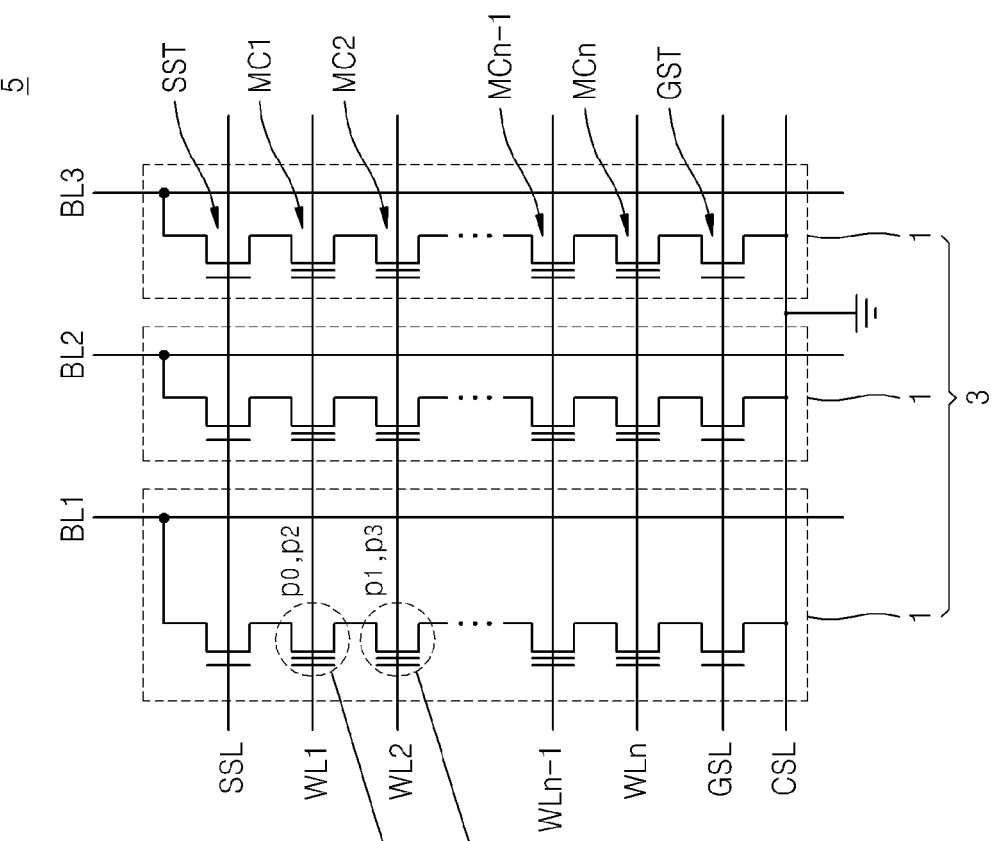

MEMORY DEVICE AND METHOD OF READING DATA FROM MEMORY DEVICE USING ELEMENT GRAPHS

CROSS-REFERENCE TO RELATED APPLICATIONS

A claim of priority under 35 U.S.C. §119 is made to Korean Patent Application No. 10-2011-0106634, filed on Oct. 18, 2011, in the Korean Intellectual Property Office, the entire contents of which are hereby incorporated by reference.

BACKGROUND

The inventive concept relates to a memory device and a method of reading data from the memory device, and more particularly, to a memory device and a method of reading data stored in the memory device using an element graph.

Generally, as memory devices become more highly integrated, widths between memory cells become smaller, and spaces between adjacent word lines and spaces between adjacent floating gates have also become smaller. Thus, interference effects caused by interference capacitance between word lines and between floating gates worsen a threshold voltage shift of cells, and thus reliability of the memory devices deteriorates.

SUMMARY

The inventive concept provides a memory device and a method of reading data from a memory device having enhanced reliability.

According to an aspect of the inventive concept, there is provided a method of reading data from memory cells, including at least one victim cell and at least one aggressor cell, using an element graph. The method includes defining function nodes corresponding to probability density functions with respect to a first physical characteristic of the at least one victim cell and a second physical characteristic of the at least one aggressor cell, defining variable nodes corresponding to at least one first data value stored in the at least one victim cell and at least one second data value stored in the at least one aggressor cell, and defining edges connecting the function nodes and the variable nodes.

The edges may be defined to connect the function nodes and the variable nodes based on a relationship of influences of the at least one first data value and the at least one second data value according to a method of programming the memory cells.

The method may further include determining the at least one first data value and the at least one second data value by applying a message passing algorithm to the element graph. The message passing algorithm may be one of a sum-product algorithm, a min-sum algorithm, a Bahl, Cocke, Jelinek and Raviv (BCJR) algorithm, or a belief propagation algorithm.

The message passing algorithm may include calculating message values based on the element graph, and determining a first metric with regard to the at least one first data value and a second metric with regard to the at least one second data value based on the calculated message values. The method may further include determining the at least one data value stored in the at least one victim cell by comparing values of the first metric, and determining the at least one second data value stored in the at least one aggressor cell by comparing values of the second metric.

The first physical characteristic may be a first threshold voltage, and the second physical characteristic may be a second threshold voltage. Also, the element graph may include a first function node corresponding to a first probability density function of the first threshold voltage, a second function node corresponding to a second probability density function of the second threshold voltage, a first variable node corresponding to the at least one first data value, a second variable node corresponding to the at least one second data value, a first edge connecting the first function node and the first variable node, a second edge connecting the second function node and the second variable node, and a third edge connecting the first function node and the second variable node.

The method may further include providing a first message from the first function node to the first variable node, a second message from the first function node to the second variable node, and a third message from the second function node to the second variable node; providing a fourth message from the first variable node to the first function node, a fifth message from the second variable node to the first function node, and a sixth message from the second variable node to the second function node; and determining a first metric with regard to the at least one first data value and determining a second metric with regard to the at least one second data value based on the first through sixth messages.

The method may further include determining the at least one first data value stored in the at least one victim cell by comparing message values of the first metric, and determining the at least one second data value stored in the at least one aggressor cell by comparing message values of the second metric.

According to another aspect of the inventive concept, there is provided a method of reading data of multiple memory cells, including at least one victim cell and at least one aggressor cell. The method includes sensing a physical characteristic of the at least one aggressor cell, sensing a physical characteristic of the at least one victim cell, and determining a data value of the at least one aggressor cell based on the physical characteristic of the at least one aggressor cell and the physical characteristic of the at least one victim cell.

Determining the data value of the at least one aggressor cell may include comparing the physical characteristic of the at least one aggressor cell with a reference value.

Determining the data value of the at least one aggressor cell may be based on a statistics distribution of a data value of the at least one victim cell according to the physical characteristic of the at least one victim cell.

The data value of the at least one aggressor cell may be determined based on the statistics distribution of data values according to the physical characteristic of the at least one victim cell when the physical characteristic of the at least one aggressor cell is within an error range of the reference value.

Determining the data value of the at least one aggressor cell may include determining a data value of the at least one victim cell by comparing the physical characteristic of the at least one victim cell with the reference value, and determining the data value of the at least one aggressor cell based on a statistics distribution of the data value of the at least one victim cell.

The memory cells, including the at least one victim cell and the at least one aggressor cell, may have a first statistics distribution when the data value is a first value (1), and a second statistic distribution when the data value is a second value (0). Determining the data value of the at least one aggressor cell based on the statistics distribution of the data value of the at least one victim cell may include, when the data value of the at least one victim cell is the first value (1), determining the data value of the at least one aggressor cell as the second value (0) as a degree of the physical characteristic of the at least one victim cell apart from an average of the first statistics distribution to the reference value becomes greater, and when the data value of the at least one victim cell is the second value (0), determining the data value of the at least one aggressor cell as the first value (1) as a degree of the physical characteristic of the at least one victim cell apart from an average of the second statistics distribution to the reference value becomes greater.

According to another aspect of the inventive concept, there is provided a memory device including a storage unit and a control unit. The storage unit includes a memory cell array having multiple memory cells, including a victim cell and an aggressor cell adjacent the victim cell in a cell string, where a threshold voltage of the victim cell varies due to the aggressor cell. The control unit is configured to control storage of data in the memory cells in the storage unit by presenting a relationship between data stored in the victim and aggressor cells and physical characteristics of the victim and aggressor cells in an element graph, and reading the data stored in the victim and aggressor cells by applying a message passing algorithm to the element graph.

BRIEF DESCRIPTION OF THE DRAWINGS

Exemplary embodiments will be more clearly understood from the following detailed description taken in conjunction with the accompanying drawings, in which:

FIG. 8 illustrates an element graph to which a method of reading data from a memory device is applied, according to another embodiment of the inventive concept;

DETAILED DESCRIPTION OF THE EMBODIMENTS

Figure 1:
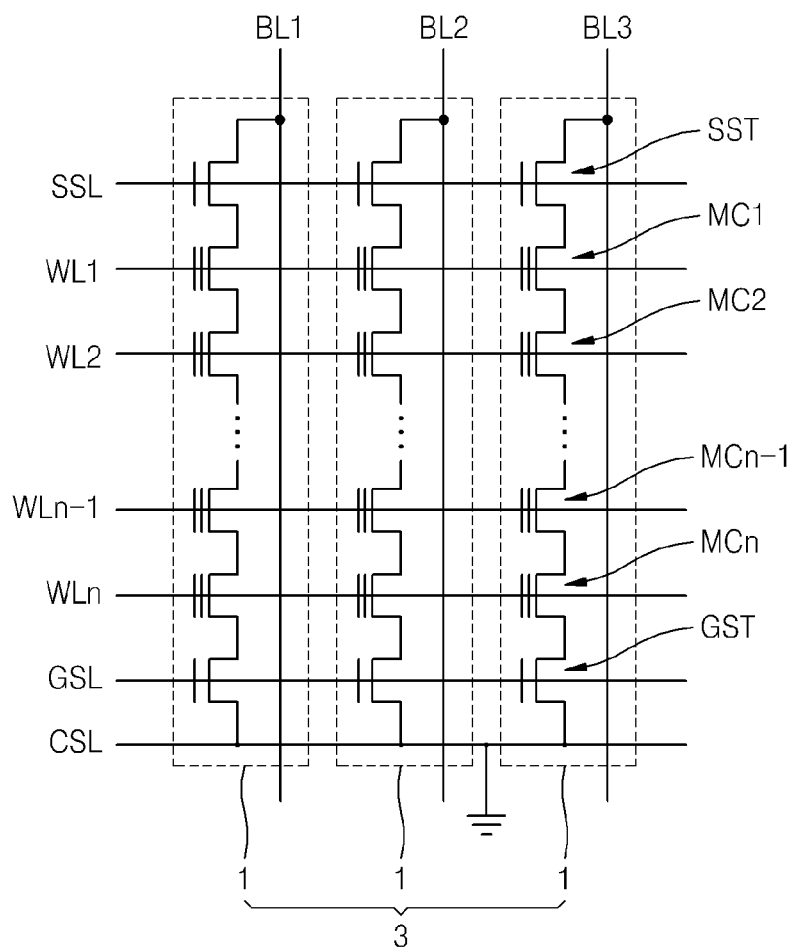
FIG. 1 is a circuit diagram schematically illustrating a memory cell array included in a memory device to which a data reading method is applied, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

The terms used herein are used to describe embodiments of the inventive concept, and not to limit the inventive concept. A singular form may include a plural form, unless otherwise defined. The term "comprise" and/or "comprising" specify the existence of mentioned shapes, numbers, steps, operations, elements, parts, and/or groups thereof, and do not exclude the existence or addition of at least one other shape, number, step, operation, element, part, and/or group thereof. As used herein, the term "and/or" includes any one of combinations of one or more of the associated listed items.

In the present description, terms, such as first, second, and the like, are used to describe various members, components, regions, layers, and/or portions. However, it will be apparent to one of ordinary skill in the art that the elements, components, areas, layers, and/or parts are not limited by these terms. The terms are used only for distinguishing one member, component, region, layer, or portion from another member, component, region, layer, or portion. Thus, a first member, region, layer, or portion may also refer to a second member, component, region, layer, or portion, within the teaching of the inventive concept.

In the drawings, the illustrated features may be changed due to, for example, a manufacturing technology and/or tolerance. Accordingly, it should be understood that the exemplary embodiments of the inventive concept are not limited to the drawings but include modifications of the features of elements caused due to, for example, the manufacture thereof. Expressions such as "at least one of," when preceding a list of elements, modify the entire list of elements and do not modify the individual elements of the list.

FIG. 1 is a circuit diagram schematically illustrating a memory cell array 5 included in a memory device to which a data reading method is applied, according to an embodiment of the inventive concept.

Referring to FIG. 1, the memory cell array 5 included in the memory device includes multiple memory cell blocks 3. Each memory cell block 3 includes a memory cell string 1. Each memory cell string 1 includes multiple memory cells MC1, MC2, . . . , MCn−1, and MCn, a string selection transistor SST, and a ground selection transistor GST. The ground selection transistor GST, the memory cells MC1, MC2, . . . , MCn−1, and MCn, and the string selection transistor SST may be sequentially connected in series to each other in each memory cell string 1. In this regard, the memory cells MC1, MC2, . . . , MCn−1, and MCn are able to store data. Multiple word lines WL1, WL2, . . . , WLn−1, and WLn are respectively coupled to the memory cells MC1, MC2, ..., MCn−1, and MCn to control the memory cells MC1, MC2, ..., MCn−1, and MCn.

Multiple bit lines BL1, BL2, and BL3 are connected to one side of each memory cell string 1 arranged in first through $m^{th}$ columns of the memory cell blocks 3. For example, bit lines BL1, BL2, and BL3 may be connected to a drain side of the string selection transistor SST. A common source line CSL is connected to another side of each memory cell string 1, for example, a source side of the ground selection transistor GST. The SST of each memory cell string 1 is arranged between the corresponding bit lines BL1, BL2, and BL3 and the memory cells MC1, MC2, ..., MCn−1, and MCn. The string selection transistors SST of the memory cell bocks 3 control data transmission between the respective bit lines BL1, BL2, and BL3 and the memory cells MC1, MC2, ..., MCn−1, and MCn.

Figure 2:
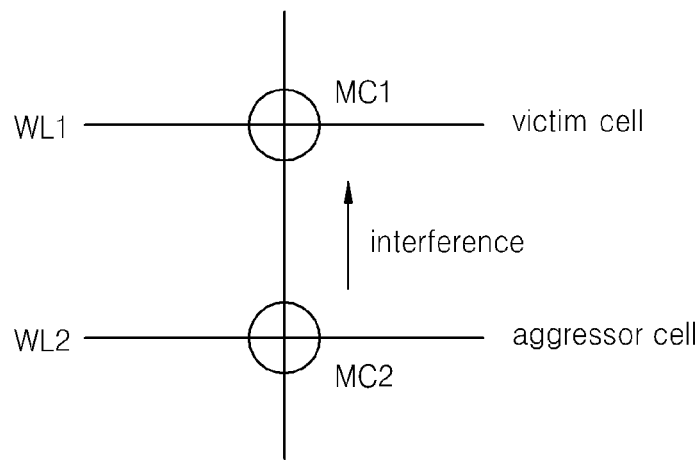
FIG. 2 is a circuit diagram schematically illustrating representative memory cells of a memory cell array included in a memory device to which a data reading method is applied, according to an embodiment of the inventive concept.

FIG. 2 is a circuit diagram schematically illustrating representative memory cells of a memory cell array included in a memory device to which a data reading method is applied, according to an embodiment of the inventive concept.

Referring to FIG. 2, a programming operation is performed on the first memory cell MC1, so that a first data value is stored in the first memory cell MC1, and then a programming operation is performed on the second memory cell MC2 so that a second data value is stored in the second memory cell MC2. In this case, an interference effect takes place between the first memory cell MC1 and the second memory cell MC2 during the programming operation of the second memory cell MC2, and accordingly a threshold voltage Vth of the first memory cell MC1 varies.

Since the threshold voltage Vth of the first memory cell MC1 varies due to the second memory cell MC2, the first memory cell MC1 may be referred to as a victim cell and the second memory cell MC2 may be referred to as an aggressor cell. As a result of coupling the victim cell and the aggressor cell, influences of the aggressor cell on the victim cell may include i) an increase/reduction in an average value of a threshold voltage of the victim cell and ii) correlations between noise components of the aggressor cell and the victim cell. This means that information regarding data included in the aggressor cell is partly included in the victim cell. This will be described further in the "Extension of Embodiments" discussion below.

The data reading method according to embodiments of the inventive concept detects data stored in memory cells in view of the fact that information regarding data included in an aggressor cell is partly included in a victim cell. That is, the data stored in the memory cells may be detected in consideration of states of the victim cell and the aggressor cell, and thus a raw bit error rate (BER) may be minimized. A method of realizing this will be described with reference to FIG. 3.

Figure 3:
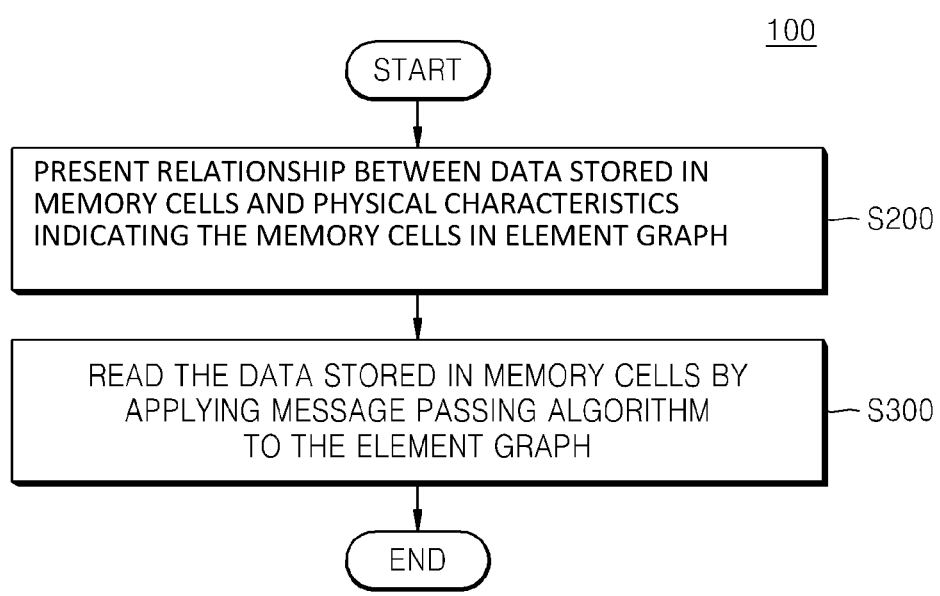
FIG. 3 is a flowchart schematically illustrating a method of reading data from a memory device, according to an embodiment of the inventive concept.

FIG. 3 is a flowchart schematically illustrating a method of reading data from a memory device, according to an embodiment of the inventive concept.

Referring to FIG. 3, the method includes operations of presenting an element graph (S200) and applying a message passing algorithm (S300). The operation of presenting the element graph (S200) includes presenting a relationship between data stored in memory cells and physical characteristics indicating the memory cells in the element graph. The operation of applying the message passing algorithm (S300) includes reading the data stored in the memory cells by applying the message passing algorithm to the element graph.

In the operation of presenting the element graph (S200), the physical characteristic may be a voltage value, a current value, and a resistance value. For example, the physical characteristics may be threshold voltages of the memory cells. The data stored in the memory cells may be a logical value of one bit or logical values of two or more bits. In the present specification, logical values of bits are defined as at least one data value.

For example, in a single level cell (SLC), a memory cell stores one data value, "0" or "1". In a multi level cell (MLC), a memory cell stores two or more data values. For example, in a 2-bit MLC, the memory cell stores two (first and second) data values, "00", "01", "10" and "11", which may be determined as listed in Table 1 below.

TABLE 1

| Data stored in memory cell | Data value of first digit | Data value of second digit |
|---|---|---|
| 00 | 0 | 0 |
| 01 | 0 | 1 |
| 10 | 1 | 0 |
| 11 | 1 | 1 |

In the present specification, a data value (for example, a "first data value" and a "second data value") stored in each memory cell during a MLC operation may include the data value of a first digit and the data value of a second digit as shown in Table 1 above. For example, it may be understood that a first memory cell stores a first data value of a first digit and a first data value of a second digit, and a second memory cell stores a second data value of a first digit and a second data value of a second digit.

In the operation of applying the message passing algorithm (S300), the message passing algorithm may be a sum-product algorithm, a min-sum algorithm, a Bahl, Cocke, Jelinek and Raviv (BCJR) algorithm, or a belief propagation algorithm, for example. The data value stored in memory cells may be determined as a result of applying the message passing algorithm to the element graph.

Methods of realizing the operation of presenting the element graph (S200) and the operation of applying the message passing algorithm (S300) will be described with reference to FIGS. 4 and 5.

Figure 4:
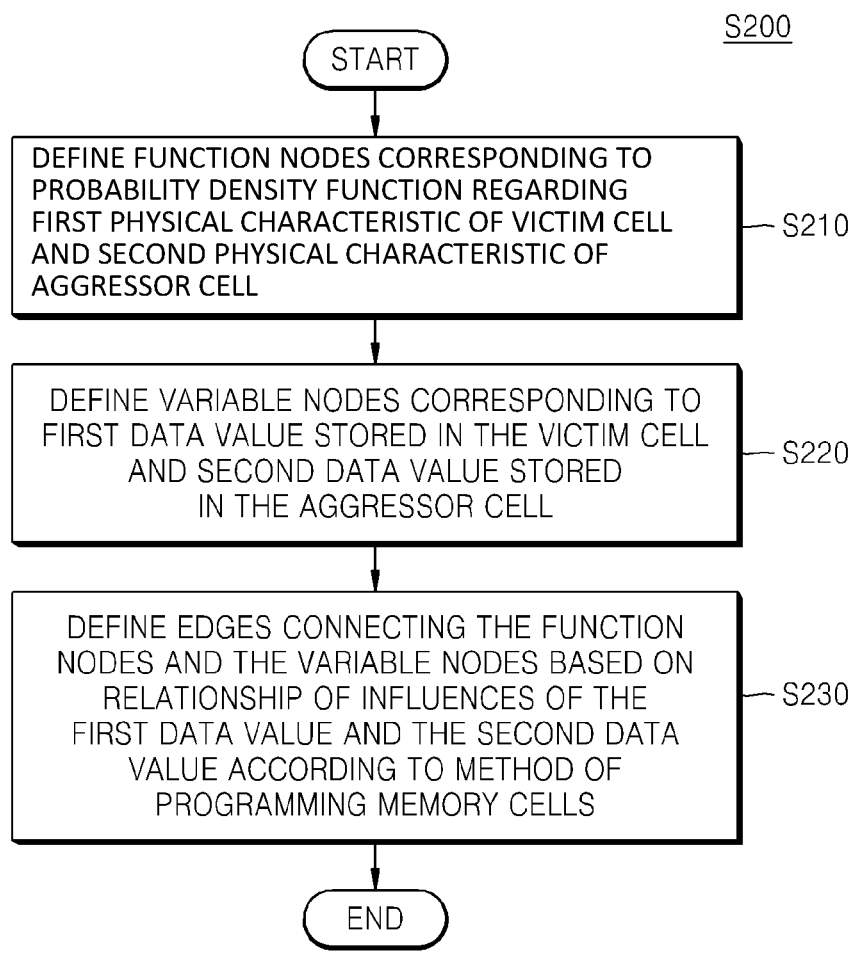
FIG. 4 is a flowchart schematically illustrating a method of reading data from a memory device, according to an embodiment of the inventive concept.

FIG. 4 is a flowchart illustrating a method of reading data from a memory device, according to an embodiment of the inventive concept.

Referring to FIG. 4, the method includes operations of defining function nodes (S210), defining variable nodes (S220), and defining edges (S230). These operations may be included in the operation of presenting the element graph (S200) of FIG. 3.

In the operation of defining the function nodes (S210), the function nodes are defined as nodes corresponding to probability density functions regarding a first physical characteristic of a victim cell and a second physical characteristic of an aggressor cell. In the operation of defining the variable nodes (S220), the variable nodes are defined as nodes corresponding to at least one first data value stored in the victim cell and at least one second data value stored in the aggressor cell.

The operation of defining the edges (S230) defines the edges connecting the function nodes and the variable nodes. In the operation of defining the edges (S230), the edges are defined connecting the function nodes and the variable nodes based on a relationship of influences of the first data value of the victim cell and the second data value of the aggressor cell according to the method of programming the memory cells. For example, the method of programming the memory cells may be a SLC programming method in which data is stored according to an order of word lines of a single string. In this case, the connection relationship between the function node and the variable node is as described with reference to FIG. 6. Alternatively, the method of programming the memory cells may be a 2-bit MLC programming method using an all-bit line and a shadow program. In this case, the connection relationship between the function node and the variable node is as described with reference to FIG. 8.

Figure 5:
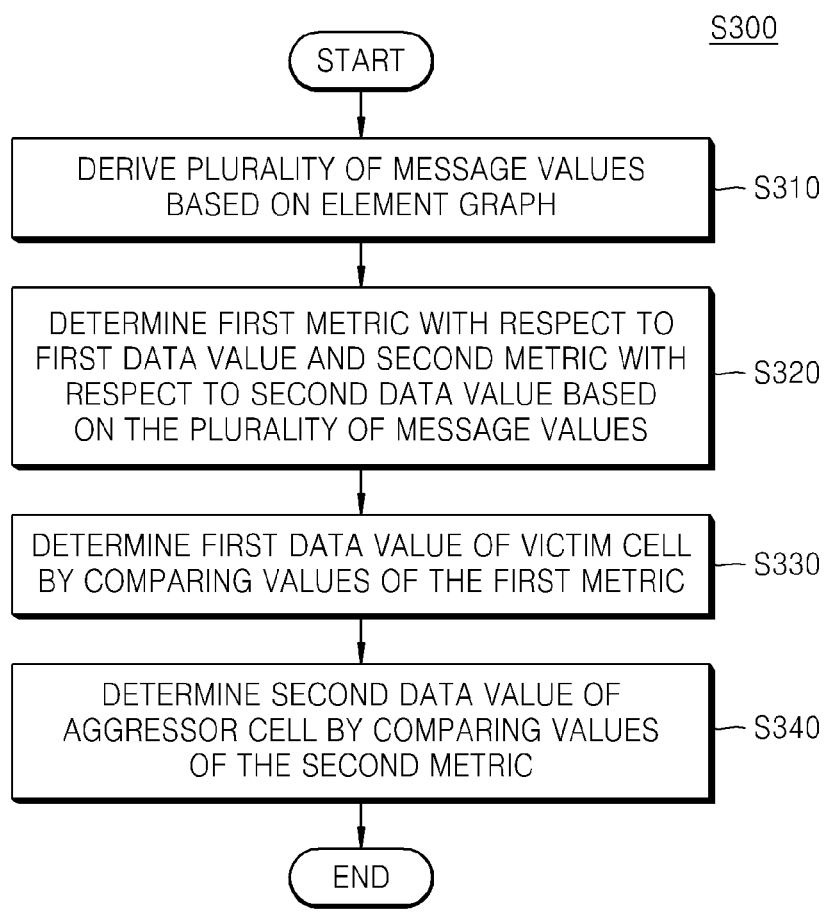
FIG. 5 is a flowchart schematically illustrating a method of reading data from a memory device, according to an embodiment of the inventive concept.

FIG. 5 is a flowchart illustrating a method of reading data from a memory device, according to an embodiment of the inventive concept.

Referring to FIG. 5, the method includes operations of reading multiple message values (S310), determining metrics (S320), determining a first data value of a victim cell (S330) and determining a second data value of an aggressor cell (S340). The above operations may be included in the operation of applying the message passing algorithm (S300) of FIG. 3.

In the operation of reading the message values (S310), the message values are derived based on an element graph. That is, the message values transferred between a function node and a variable node according to the edge described with reference to FIG. 4 may be derived. Examples of deriving the message values will be described with reference to FIGS. 7 and 9.

In the operation of determining metrics (S320), a first metric with respect to a first data value and a second metric with respect to a second data value are determined based on the derived message values. In this regard, the metrics may be defined as reliability estimation values with respect to data values and calculated based on the message values. Examples of determining the metrics will be described with reference to FIGS. 7 and 9.

In the operations of determining the first and second data values (S330 and S340), the first data value of the victim cell may be determined by comparing values of the first metric, and the second data value of the aggressor cell may be determined by comparing values of the second metric. For example, since the first metric is defined as a reliability estimation value with respect to the first data value, the first data value is determined by comparing the value of the first metric if the first data value assumed to be 1 with the value of the first metric if the first data value assumed to be 0. In an embodiment, the first data value of the victim cell is determined as 1 when the value of the first metric in the case where the first data value is assumed to be 1 is determined to be greater than the value of the first metric in the case where the first data value is assumed to be 0. Likewise, the first data value of the victim cell is determined as 0 when the value of the first metric in the case where the first data value is assumed to be 0 is determined to be greater than the value of the first metric in the case where the first data value is assumed to be 1.

The second data value of the aggressor cell may be determined in the same manner. That is, the second data value of the aggressor cell may be determined by comparing the value of the second metric if the second data value is assumed to be 1 with the value of the second metric if the second data value is assumed to be 0. In an embodiment, the second data value of the aggressor cell is determined as 1 when the value of the second metric in the case where the second data value is assumed to be 1 is determined to be greater than the value of the second metric in the case where the second data value is assumed to be 0. Likewise, the second data value of the aggressor cell is determined as 0 when the value of the second metric in the case where the second data value is assumed to be 0 is determined to be greater than the value of the second metric in the case where the second data value is assumed to be 1.

Figure 6:
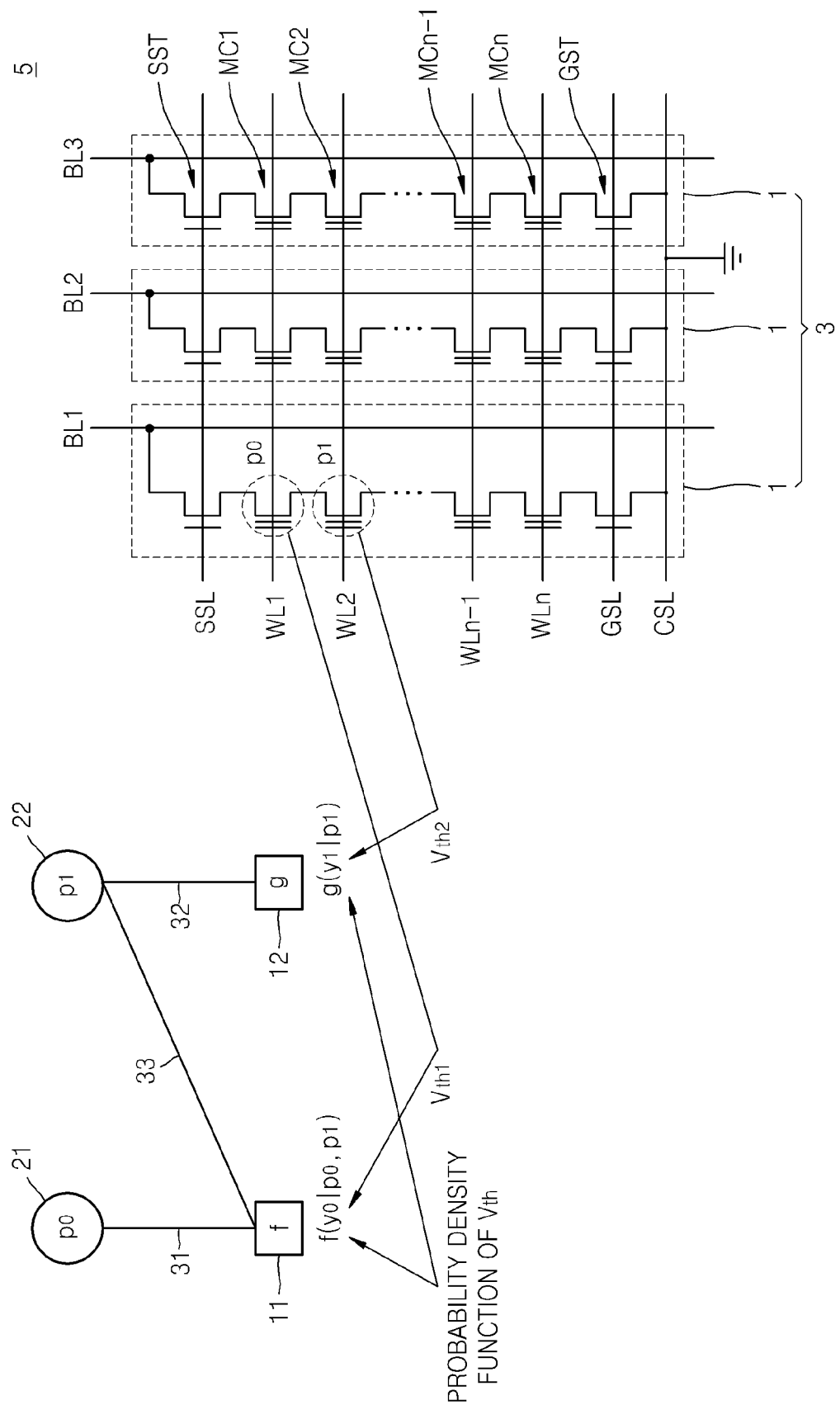
FIG. 6 illustrates an element graph to which a method of reading data from a memory device is applied, according to an embodiment of the inventive concept.

FIG. 6 illustrates an element graph to which a method of reading data from a memory device is applied, according to an embodiment of the inventive concept. The element graph refers to a relationship between data values stored in memory cells and physical characteristics of the memory cells, and may be expressed through the operations of defining the function node (S210), defining the variable node (S220), and defining the edges (S230) described with reference to FIG. 4. Redundant descriptions between FIGS. 4 and 6 are not provided here.

A method of programming memory cells may be a SLC programming method of storing data according to an order of word lines of a single string. It is assumed that the physical characteristics of the memory cells indicate threshold voltages of the memory cells, for example.

Referring to FIG. 6, in the operation of defining the function node (S210 of FIG. 4), a first function node 11 is defined corresponding to a probability density function of a first threshold voltage of the first memory cell MC1 that is a victim cell, and a second function node 12 is defined corresponding to a probability density function of a second threshold voltage of the second memory cell MC2 that is an aggressor cell. To obtain the probability density functions of the first function node 11 and the second function node 12, the first threshold voltage $y_0$ may be defined according to Equation 1 below.

$$y_0 = s_0(p_0) + \alpha \Delta s_1(p_1) + n_0 \quad \text{[Equation 1]}$$

In this regard, $s_0(p_0)$ denotes an average value of the first threshold voltage of the first memory cell MC1 that is the victim cell, $\Delta s_1(p_1)$ denotes a difference (i.e., a change amount) before and after movement of an average threshold voltage value of a dispersion of the second memory cell MC2 connected to a second word line, $\alpha$ denotes an interference coupling coefficient, and $n_0$ denotes a noise component reflected on the first threshold voltage, and may be a probability variable having a Gaussian distribution, for example.

Also, the second threshold voltage $y_1$ may be defined according to Equation 2 below.

$$y_1 = s_1(p_1) + n_1 \quad \text{[Equation 2]}$$

In this regard, $s_1(p_1)$ denotes an average value of the second threshold voltage of the second memory cell MC2 that is the aggressor cell, and $n_1$ denotes a noise component reflected on the second threshold voltage, and may be a probability variable having the Gaussian distribution, for example.

In this case, the first probability density function of the first function node 11 and the second probability density function of the second function node 12 may be defined according to Equations 3 and 4 below.

$$f(y_0 \mid p_0, p_1) = \frac{1}{\sqrt{2\pi\sigma^2}} \exp\left(-\frac{(y_0 - s_0(p_0) - \alpha \Delta s_1(p_1))^2}{2\sigma^2}\right) \quad \text{[Equation 3]}$$

$$g(y_1 \mid p_1) = \frac{1}{\sqrt{2\pi\sigma^2}} \exp\left(-\frac{(y_0 - s_1(p_1))^2}{2\sigma^2}\right) \quad \text{[Equation 4]}$$

In this regard, $\sigma^2$ denotes an average power of the noise components.

In the operation of defining the variable nodes (S220 of FIG. 4), a first variable node 21 may be defined corresponding to the first data value stored in the first memory cell MC1, and a second variable node 22 may be defined corresponding to the second data value stored in the second memory cell MC2.

In the operation of defining the edges (S230 of FIG. 4), a first edge 31, indicating that the first data value is data stored in the first memory cell MC1, may be defined to connect the first function node 11 and the first variable node 21. Also, a second edge 32, indicating that the second data value is data stored in the second memory cell MC2, may be defined to connect the second function node 12 and the second variable node 22. Furthermore, a third edge 33, indicating that the first memory cell MC1 is influenced (i.e., coupling between the aggressor cell and the victim cell) by the second data value may be defined to connect the first function node 11 and the second variable node 22.

Through the operations of defining the function node (S210), defining the variable node (S220), and defining the edge (S230) described above, the element graph may be expressed with respect to a SLC programming method of storing data according to an order of word lines of a single string.

Figure 7:
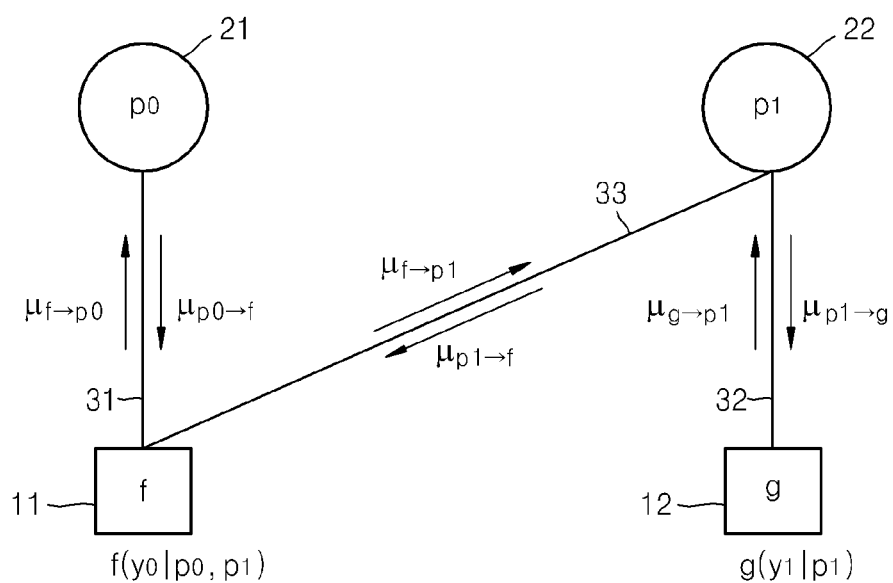
FIG. 7 is a block diagram illustrating calculating message values by applying a message passing algorithm based on the element graph of FIG. 6, according to an embodiment of the inventive concept.

FIG. 7 illustrates calculating message values by applying a message passing algorithm based on the element graph of FIG. 6. The message values may be calculated through the operation of reading the message values (S310) described with reference to FIG. 5.

Referring to FIG. 7, the operation of reading the message values (S310 of FIG. 5) include first and second operations. The first operation includes the first variable node 21 receiving a first message $\mu_{f \to p_0}$ from the first function node 11, the second variable node 22 receiving a second message $\mu_{f \to p_1}$ from the first function node 11, and the second variable node 22 receiving a third message $\mu_{g \to p_1}$ from the second function node 12. The second operation includes the first function node 11 receiving a fourth message $\mu_{p_0 \to f}$ from the first variable node 21, the first function node 11 receiving a fifth message $\mu_{p_1 \to f}$ from the second variable node 22, and the second function node 12 receiving a sixth message $\mu_{p_1 \to g}$ from the second variable node 22.

The first message $\mu_{f \to p_0}$ may be defined according to Equation 5 below.

$$\mu_{f \to p_0} = \sum_{\sim p_0} (f(y_0 \mid p_0, p_1) \mu_{p_1 \to f}) \qquad \text{[Equation 5]}$$
$$= f(y_0 \mid p_0, p_1 = 0) + f(y_0 \mid p_0, p_1 = 1)$$

The second message $\mu_{f \to p_1}$ may be defined according to Equation 6 below.

$$\mu_{f \to p_1} = \sum_{\sim p_1} (f(y_0 \mid p_0, p_1) \mu_{p_0 \to f}) \qquad \text{[Equation 6]}$$
$$= f(y_0 \mid p_0 = 0, p_1) + f(y_0 \mid p_0 = 1, p_1)$$

The third message $\mu_{g \to p_1}$ may be defined according to Equation 7 below.

$$\mu_{g \to p_1} = g(y_1 \mid p_1) \qquad \text{[Equation 7]}$$

The fourth message $\mu_{p_0 \to f}$ may be defined according to Equation 8 below.

$$\mu_{p_0 \to f} = 1 \qquad \text{[Equation 8]}$$

The fifth message $\mu_{p_1 \to f}$ may be defined according to Equation 9 below.

$$\mu_{p_1 \to f} = \mu_{g \to p_1} \qquad \text{[Equation 9]}$$
$$= g(y_1 \mid p_1)$$

The sixth message $\mu_{p_1 \to g}$ may be defined according to Equation 10 below.

$$\mu_{p_1 \to g} = \mu_{f \to p_1} \qquad \text{[Equation 10]}$$
$$= f(y_1 \mid p_0 = 0, p_1) + f(y_1 \mid p_0 = 1, p_1)$$

Thereafter, a first metric $\lambda(p_0)$ with respect to the first data value and a second metric $\gamma(p_1)$ with respect to the second data value are determined based on the first through sixth messages.

The first metric $\lambda(p_0)$ may be defined according to Equation 11 below.

$$\lambda(p_0) = \mu_{f \to p_0} \mu_{p_0 \to f} \qquad \text{[Equation 11]}$$
$$= f(y_0 \mid p_0, p_1 = 0) + f(y_0 \mid p_0, p_1 = 1)$$

The second metric $\gamma(p_1)$ may be defined according to Equation 12 below.

$$\gamma(p_1) = \mu_{g \to p_1} \mu_{p_1 \to g} \qquad \text{[Equation 12]}$$
$$= g(y_1 \mid p_1)(f(y_0 \mid p_0 = 0, p_1) + f(y_0 \mid p_0 = 1, p_1))$$

Thereafter, the first data value of the victim cell is determined by comparing the message values of the first metric $\lambda(p_0)$, and the second data value of the aggressor cell is determined by comparing the message values of the second metric $\gamma(p_1)$.

An example of deriving data values using the first through sixth message values and the first and second metrics will be described below.

Specific Example

Multiple memory cells, including a victim cell and an aggressor cell, have a first statistics distribution when the data value is 1 and a second statistics distribution when the data value is 0. In this case, it is assumed that an average of the first statistics distribution is −1, an average of the second statistics distribution is 1, and a standard deviation of the averages is 0.3. When the data value varies from 1 to 0, it is assumed that an influence of neighboring cells is equivalent to 0.5.

In this case, dispersion measurement information may be presented according to Table 2 below.

TABLE 2

| Data value (p) | s(p) | Σ | α∆s(p) |
|---|---|---|---|
| 0 | 1 | 0.3 | 0.5 |
| 1 | −1 | 0.3 | 0 |

Also, in the present example, it is assumed that first data value $p_0$ stored in the first memory cell MC1 is 1, and second data value $p_1$ stored in the second memory cell MC2 is 0.

To read the data stored in the first memory cell MC1 and the second memory cell MC2, first threshold voltage $y_0$ of the first memory cell and second threshold voltage $y_1$ of the second memory cell may be measured. For example, when the first threshold voltage $y_0$ is −0.6V, and the second threshold voltage $y_1$ is −0.01V, the conventional method of reading data detects 1 as both the first and second data values, and thus an error occurs.

However, in the present example, according to embodiments of the inventive concept, the relationship between the first data value and the second data value, and the relationship between the first threshold voltage and the second threshold voltage, are expressed in an element graph. A message passing algorithm is applied to the element graph, and thus the first data value and the second data value may be accurately determined.

In a first operation of calculating the message values, the first through third message values may be calculated according to Table 3 below by applying Equations 5 through 7 above.

TABLE 3

| Message values | p = 0 | p = 1 |
|---|---|---|
| First message ($\mu_{f \to p0}$) | 0.0000 | 1.8046 |
| Second message ($\mu_{f \to p1}$) | 1.2579 | 0.5467 |
| Third message ($\mu_{g \to p1}$) | 0.0046 | 0.0057 |

In a second operation of calculating the message values, the fourth through sixth message values may be calculated according to Table 4 below by applying Equations 8 through 10 above.

TABLE 4

| Message values | p = 0 | p = 1 |
|---|---|---|
| Fourth message ($\mu_{p0 \to f}$) | 1 | 1 |
| Fifth message ($\mu_{p1 \to f}$) | 0.0046 | 0.0057 |
| Sixth message ($\mu_{p1 \to g}$) | 1.2579 | 0.5467 |

Thereafter, in the operation of determining metrics (S320), metric values may be calculated according to Table 5 below by applying Equations 11 and 12 above.

TABLE 5

| Metrics | p = 0 | p = 1 |
|---|---|---|
| First metric ($\lambda(p_0)$) | 0.0000 | 1.8046 |
| Second metric ($\gamma(p_1)$) | 0.0058 | 0.0031 |

Thereafter, the first data value of the victim cell is determined by comparing the message values of the first metric $\lambda(p_0)$, and the second data value of the aggressor cell is determined by comparing the message values of the second metric $\gamma(p_1)$.

Referring to Table 5 above, since the value (1.8046) of the first metric when the first data value is 1 is greater than the value (0.0000) of the first metric when the first data value is 0, the first data value of the first memory cell MC1 that is the victim cell is determined to be 1. Meanwhile, since the value (0.0058) of the second metric when the second data value is 0 is greater than the value (0.0031) of the second metric when the second data value is 1, the second data value of the second memory cell MC2 that is the aggressor cell is determined to be 0. It may be confirmed that the error occurring using the conventional method of reading data has been corrected.

In the conventional art, it is difficult to clearly determine whether the second data value of the second memory cell MC2 is 0 or 1 since a measured second threshold voltage of the second memory cell MC2 is close to 0, i.e., the second threshold voltage is within an error range of a reference voltage.

However, since the measured first threshold voltage of the first memory cell MC1 has a relatively large value (i.e., a value somewhat away from a center of −1) owing to a coupling effect by the second memory cell MC2, it is likely that the second data value stored in the second memory cell MC 2 is 0. The data reading method according to the embodiment of the inventive concept uses the element graph and the message passing algorithm, and thus it is technically advantageous that the probability information may be considered.

Figure 9:
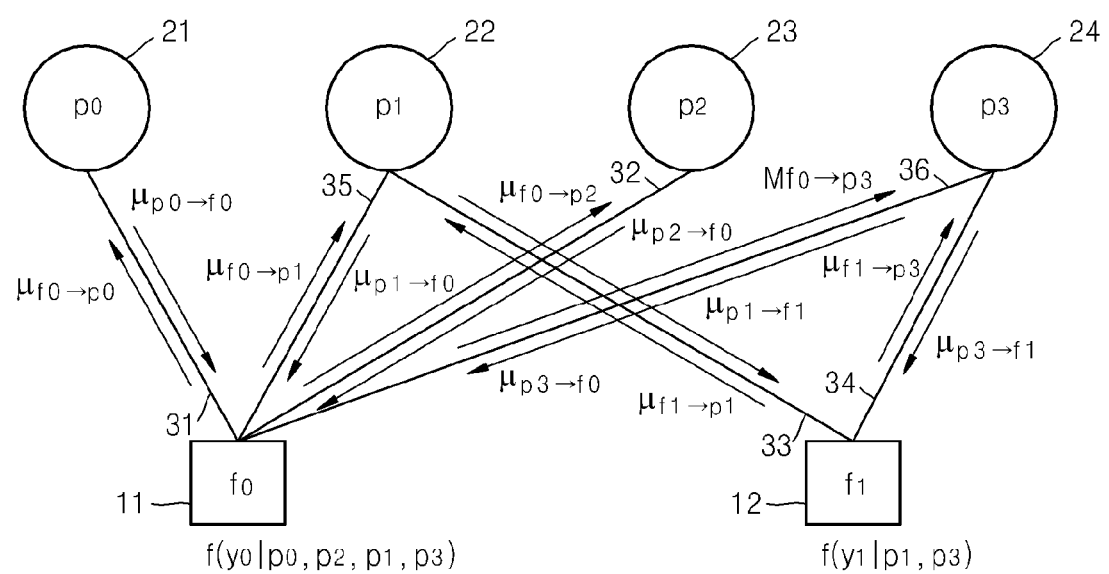
FIG. 9 is a block diagram illustrating calculating message values by applying a message passing algorithm based on the element graph of FIG. 8, according to another embodiment of the inventive concept.

FIGS. 8 and 9 are variations of FIGS. 6 and 7, respectively, assuming that a method of programming multiple memory cells is a 2-bit MLC programming method using an all-bit line and a shadow program. Redundant descriptions between FIGS. 6 through 9 will be omitted.

Referring to FIG. 8, in the operation of defining the function node (S210 of FIG. 4), the first function node 11 may be defined corresponding to a probability density function of a first threshold voltage of the first memory cell MC1 that is a victim cell, and a second function node 12 may be defined corresponding to a probability density function of a second threshold voltage of the second memory cell MC2 that is an aggressor cell. To obtain the first probability density function of the first function node 11 and the second probability density function of the second function node 12, the first threshold voltage $y_0$ may be defined according to Equation 13 below.

$$y_0 = s_0(p_0, p_2) + \alpha \Delta s_1(p_1, p_3) + n_0 \quad \text{[Equation 13]}$$

In this regard, $s_0(p_0, p_2)$ denotes an average value of the first threshold voltage of the first memory cell MC1 that is a victim cell, $\Delta s_1(p_1, p_3)$ denotes a difference (i.e., a change amount) before and after a movement of an average threshold voltage value of a dispersion of the second memory cell MC2 connected to a second word line, $\alpha$ denotes an interference coupling coefficient, and $n_0$ denotes a noise component reflected on the first threshold voltage, and may be a probability variable having the Gaussian distribution.

Also, the second threshold voltage $y_1$ may be defined according to Equation 14 below.

$$y_1 = s_1(p_1, p_3) + n_1 \quad \text{[Equation 14]}$$

In this regard, $s_1(p_1, p_3)$ denotes an average value of the second threshold voltage of the second memory cell MC2 that is an aggressor cell, and $n_1$ denotes a noise component reflected on the second threshold voltage, and may be a probability variable having the Gaussian distribution.

In this case, the first probability density function of the first function node 11 and the second probability density function of the second function node 12 may be defined according to Equations 15 and 16 below.

$$f(y_0 \mid p_0, p_2, p_1, p_3) = \frac{1}{\sqrt{2\pi\sigma_0^2}} \exp\left(-\frac{(y_0 - s_0(p_0, p_2) - \alpha\Delta s_1(p_1, p_3))^2}{2\sigma_0^2}\right) \quad \text{[Equation 15]}$$

$$f(y_1 \mid p_1, p_3) = \frac{1}{\sqrt{2\pi\sigma_1^2}} \exp\left(-\frac{(y_1 - s_1(p_1, p_3))^2}{2\sigma_1^2}\right) \quad \text{[Equation 16]}$$

In this regard, $\sigma_k^2$ denotes an average power of the noise components.

In the operation of defining the variable node (S220 of FIG. 4), the first variable node 21 and a third variable node 23 may be defined corresponding to the first data value stored in the first memory cell MC1, and the second variable node 22 and a fourth variable node 24 may be defined corresponding to the second data value stored in the second memory cell MC2.

In the operation of defining the edge (S230 of FIG. 4), the first edge 31 may be defined to connect the first function node 11 and the first variable node 21, and the second edge 32 may be defined to connect the first function node 11 and the third variable node 23, so that the first data value is data stored in the first memory cell MC1. Also, the third edge 33 may be defined to connect the second function node 12 and the second variable node 22, and a fourth edge 34 may be defined to connect the second function node 12 and the fourth variable node 24, so that the second data value is data stored in the second memory cell MC2. Furthermore, a fifth edge 35 may be defined to connect the first function node 11 and the second variable node 22, and a sixth edge 36 may be defined to connect the first function node 11 and the fourth variable node 24, so that the first memory cell MC1 is influenced (i.e., coupling between the aggressor cell and the victim cell) by the second data value.

Referring to FIG. 9, in the operation of reading the message values (S310 of FIG. 5), all messages for each edge may be determined according to Equations 17 and 18 below.

$$\mu_{f_0 \to p_0} = \sum_{\sim p_0} (f(y_0 \mid p_0, p_2, p_1, p_3) \mu_{p_1 \to f_0} \mu_{p_2 \to f_0} \mu_{p_3 \to f_0})$$ [Equation 17]

$$\mu_{f_0 \to p_1} = \sum_{\sim p_1} (f(y_0 \mid p_0, p_2, p_1, p_3) \mu_{p_0 \to f_0} \mu_{p_2 \to f_0} \mu_{p_3 \to f_0})$$

$$\vdots$$

$$\mu_{p_0 \to f_0} = 1$$ [Equation 18]

$$\mu_{p_1 \to f_0} = \mu_{f_1 \to p_1}$$

$$\mu_{p_1 \to f_1} = \mu_{f_0 \to p_1}$$

$$\vdots$$

Thereafter, a first metric with respect to the first data value and a second metric with respect to the second data value are determined based on the messages calculated in the operation of determining metrics (S320 of FIG. 5). Finally, in the operations of determining data values (S330 and S340), the first data value of the victim cell is determined by comparing message values of the first metric, and the second data value of the aggressor cell is determined by comparing message values of the second metric, as discussed above.

Although the present specification describes the embodiments regarding a SLC and a 2-bit MLC, the inventive concept is not limited thereto, which may be applied to a 3-bit or more MLC memory device without departing from the scope of the present teachings. Furthermore, even for the same SLC/MLC, connections between nodes and functions defined by each function node may differ according to a programming method.

Selectively, the first through fourth variable nodes 21 through 24 shown in FIG. 8 may include coded bits. In this case, the coded bits may also be expressed in an element graph. Joint channel compensation and an iterative decoding may be applied based on the above structure, and thus reliability may be further enhanced.

Although two memory cells MC1 and MC2, i.e., one victim cell and one aggressor cell, are described in the above embodiments, this is merely for simplicity of description, and the inventive concept is not limited thereto. That is, the technical idea of the inventive concept may be applied to any number of memory cells. This will be described in more detail with reference to FIG. 10.

Figure 10:
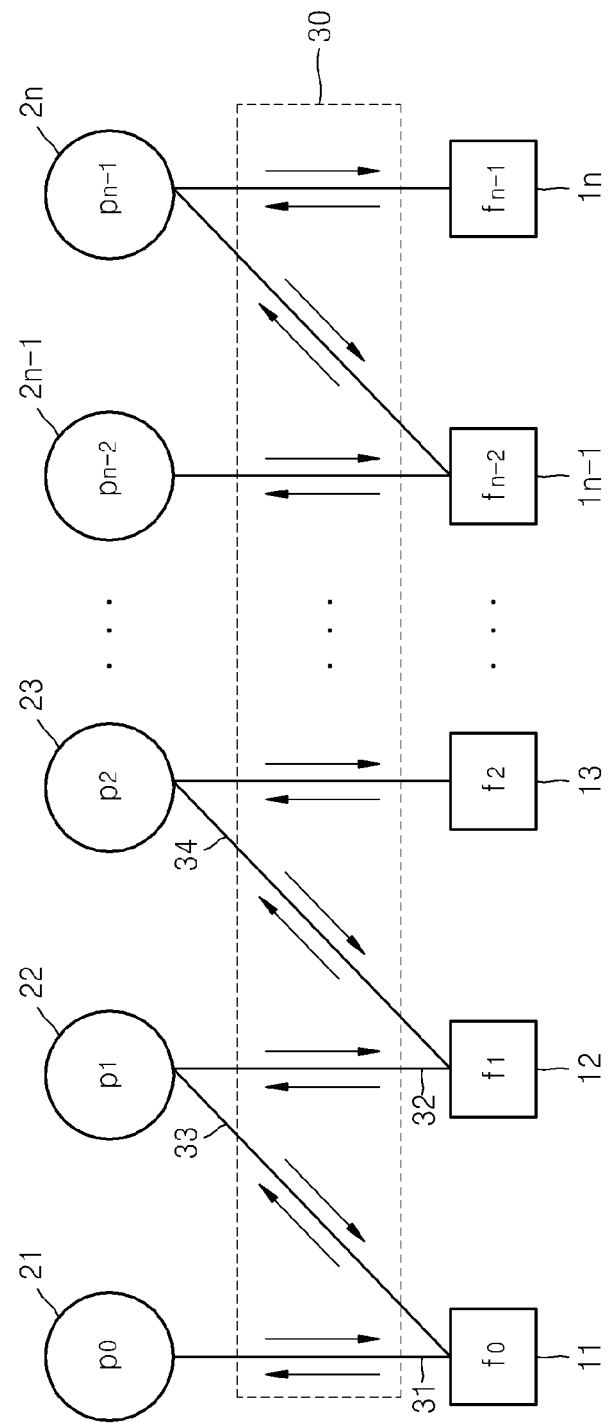
FIG. 10 corresponds to FIGS. 6 and 7 and illustrates an n number of memory cells expressed in an element graph, according to an embodiment of the inventive concept.

FIG. 10 corresponds to FIGS. 6 and 7 and illustrates an n number of memory cells MC1, MC2, ..., MCn−1, and MCn expressed in an element graph.

Referring to FIGS. 1 and 10, the n number of memory cells MC1, MC2, ..., MCn−1, and MCn of the memory cell string 1 may be expressed in the element graph in an SLC programming method of storing data in an order of word lines of a single string. In this case, although the first memory cell MC1 corresponds to a victim cell influenced by the second memory cell MC2, the second memory cell MC2 may be an aggressor cell influencing the first memory cell MC1 and simultaneously a victim cell influenced by a third memory cell (not shown).

Referring to FIG. 10, the element graph may include an n number of function nodes 11, 12, ..., 1n−1, 1n, and an n number of variable nodes 21, 22, ..., 2n−1, 2n, where n is a positive integer greater than 2. Furthermore, the element graph may include edges 30 connecting the n number of function nodes 11, 12, ..., 1n−1, 1n and the n number of variable nodes 21, 22, ..., 2n−1, 2n.

As described with reference to FIG. 7, since the first memory cell (MC1 of FIG. 1) corresponds to a victim cell influenced by the second memory cell (MC2 of FIG. 1), in addition to an edge 31 generated between the first function node 11 and the first variable node 21, an edge 33 is generated between the first function node 11 and the second variable node 22.

Referring to FIG. 10, since the second memory cell (MC2 of FIG. 1) is an aggressor cell influencing the first memory cell (MC1 of FIG. 1) and simultaneously a victim cell influenced by a third memory cell (not shown), in addition to an edge 32 generated between the second function node 12 and the second variable node 22, an edge 34 is generated between the second function node 12 and the third variable node 23. Relations between the n number of memory cells MC1, MC2, ..., MCn−1, and MCn may be expressed in the element graph based on the victim-aggressor relation. Although the n number of memory cells MC1, MC2, ..., MCn−1, and MCn of the memory cell string is expressed in the element graph on the assumption of the SLC programming method of storing data in an order of word lines of a single string in FIG. 10, the inventive concept is not limited thereto. That is, the n number of memory cells MC1, MC2, ..., MCn−1, and MCn of the memory cell string may be expressed in the element graph in a 2-bit MLC programming method using an all-bit line and a shadow program. Also, the n number of memory cells MC1, MC2, ..., MCn−1, and MCn of the memory cell string may be expressed in the element graph in a 3-bit or more MLC programming method other than the 2-bit MLC programming method.

Extension of Embodiments

Although the foregoing embodiments describe using an element graph and a message passing algorithm, the inventive concept is not limited thereto. Basically, the technical idea of the inventive concept, e.g., as described with reference to FIG. 2, may be generalized in that data stored in memory cells are detected using the fact that information regarding data included in an aggressor cell is partly included in a victim cell. An expression of the element graph and an application of the message passing algorithm are merely an embodiment.

For example, physical characteristics of the aggressor cell and the victim cell may be sensed, and a data value of the aggressor cell may be determined based on the physical characteristics of the aggressor cell and the victim cell. Since information regarding data stored in the aggressor cell is partly included in the physical characteristic of the victim cell, the physical characteristic of the victim cell may be sensed during reading of the data stored in the aggressor cell, the data stored in the victim cell may be read, and the data value of the aggressor cell may be determined using the data stored in the victim cell. The data stored in the victim cell may be determined by comparing the physical characteristic of the victim cell with a reference value, and the data value of the aggressor cell may be determined based on a statistics distribution of a data value of the victim cell.

More specifically, as another example, the following data reading method may be used, according to an embodiment of the inventive concept.

The data value of the aggressor cell is determined by sensing a physical characteristic of the aggressor cell and comparing the physical characteristic of the aggressor cell with a reference value. When a threshold voltage of the aggressor cell is beyond an error range of a reference voltage, for example, it is not difficult to determine the data value. Thus, when the threshold voltage of the aggressor cell is less than the reference voltage, the data value of the aggressor cell may be determined as a first value (1), and when the threshold voltage of the aggressor is higher than the reference voltage, the data value may be determined as a second value (0).

Meanwhile, when the threshold voltage of the aggressor cell is within the error range of the reference value, it is difficult to determine the data value. Thus, the data value of the victim cell may be determined by comparing the threshold voltage of the victim cell with the reference voltage, and then the threshold voltage of the aggressor cell may be determined based on a statistics distribution of the data value of the victim cell.

More specifically, multiple memory cells including the victim cell and the aggressor cell may include a first statistics distribution when the data value is the first value (1), and include a second statistic distribution when the data value is the second value (0). In this case, for example, when the data value of the victim cell is the first value (1), as a degree of the physical characteristic of the victim cell apart from an average of the first statistics distribution to the reference value becomes greater, the data value of the aggressor cell may be determined as the second value (0). When the data value of the victim cell is the second value (0), as a degree of the physical characteristic of the victim cell apart from an average of the second statistics distribution to the reference value becomes greater, the data value of the aggressor cell may be determined as the first value (1).

As described above, the data reading method according to the embodiments of the inventive concept may detect data from memory cells in view of states of the victim cell and the aggressor cell, and accordingly minimize a raw BER.

Figure 11:
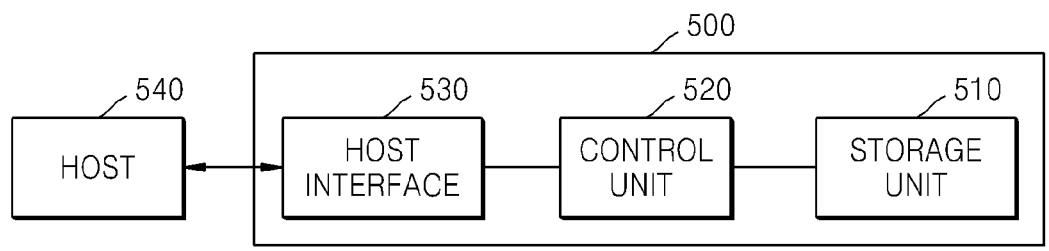
FIG. 11 is a block diagram of a memory device using a data reading method, according to embodiments of the inventive concept.
Figure 12:
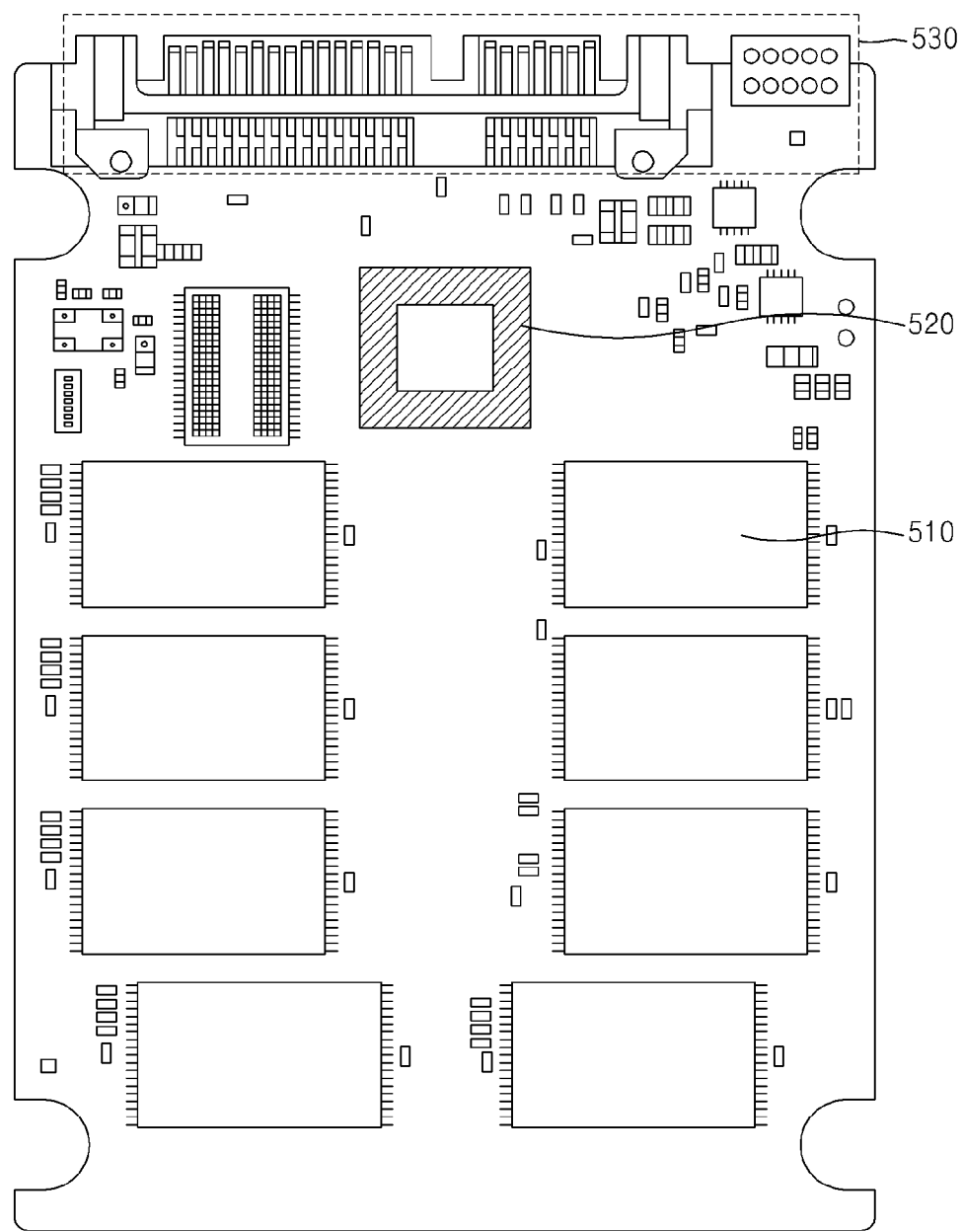
FIG. 12 is a plan view of a memory device using a data reading method, according to embodiments of the inventive concept.

FIG. 11 is a block diagram and FIG. 12 is a plan view of a memory device 500, configured to use a data reading method, according to embodiments of the inventive concept.

Referring to FIGS. 11 and 12, the memory device 500 includes a storage unit 510, a control unit 520 and a host interface 530. The memory device 500 may include a solid state drive (SSD), a memory module, a memory card, a memory semiconductor package, or a combination of these, for example. More particularly, the memory card may include a PC card (PCMIA), a compact flash card (CF), a smart media card (SM/MMC), a memory stick, a multimedia card (MMC, RS-MMC, MMCmicro), an SD card (SD, miniSD, microSD), a universal flash storage (UFS), or a combination of these.

The host interface 530 communicates with a host 540. That is, the host interface 530 receives data to be recorded in the storage unit 510 from the host 540, or transmits data loaded from the storage unit 510 to the host 540. The host interface 530 may include a protocol used to exchange data between the host 540 and the storage unit 510, such as Universal Serial Bus (USB), MMC, PCI-E, advanced technology attachment (ATA), serial-ATA, parallel-ATA, Small Computer System Interface (SCSI), Enhanced Small Device Interface (ESDI), and integrated drive electronics (IDE), for example.

The control unit 520 may receive data from the host interface 530 and store the data in the storage unit 510, under control of the control unit 520. That is, the control unit 520 may read data stored in the storage unit 510 and transfer the data to the host interface 530. The control unit 520 is configured to implement the data reading method according to embodiments of the inventive concept when reading the data.

Figure 13:
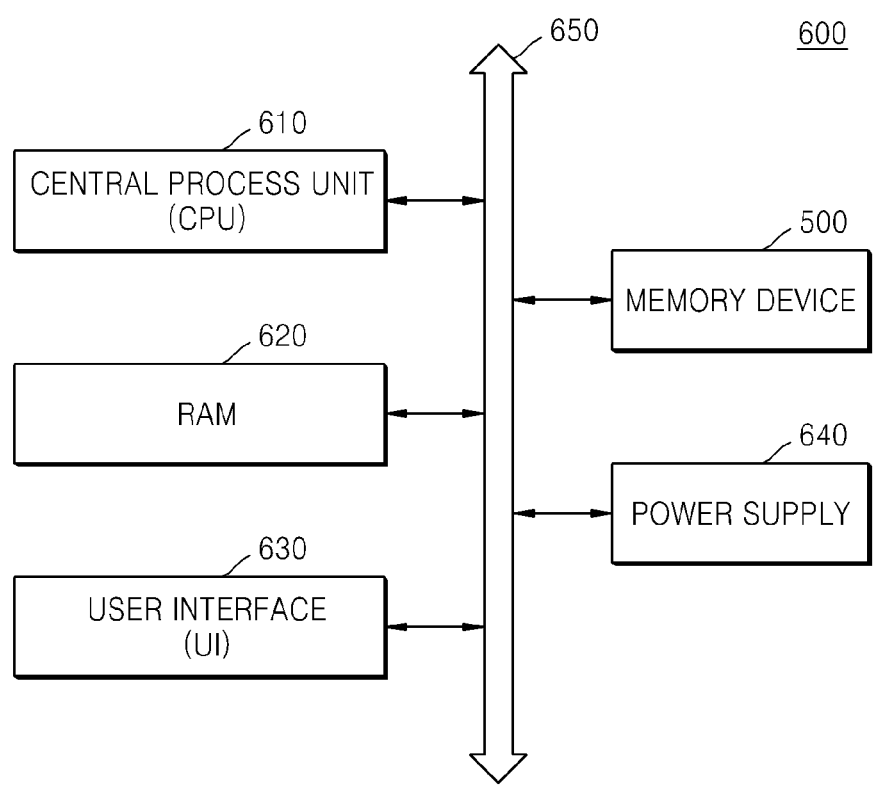
FIG. 13 is a block diagram of a computing system including a memory device, according to embodiments of the inventive concept.

FIG. 13 is a block diagram of a computing system 600 including the memory device 500, according to an embodiment of the inventive concept.

Referring to FIG. 13, the computing system 600 includes a central processor unit (CPU) 610, random access memory (RAM) 620, a user interface (UI) 630, a power supply 640, and the memory device 500. The memory device 500 is electrically connected to the CPU 610, the RAM 620, the UI 630, and the power supply 640 via a system bus 650. Data that is provided through the UI 630 or processed by the CPU 610 is stored in the memory device 500. The memory device 500 may be realized as a SSD. In this case, booting speed of the computing system 600 may be dramatically increased. Although not shown, the computing system 600 of the present embodiment may further include an application chipset, a camera image processor, or the like.

Elements illustrated in the drawings, which are provided for clear understanding of the inventive concept, should be regarded as illustrative only. It should be understood that the elements may be modified in various forms other than the illustrated ones. The same reference numerals refer to the same constitutional elements throughout the drawings.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of reading data from a plurality of memory cells, comprising at least one victim cell and at least one aggressor cell using an element graph, the method comprising:

defining function nodes corresponding to probability density functions with respect to a first physical characteristic of the at least one victim cell and a second physical characteristic of the at least one aggressor cell;

defining variable nodes corresponding to at least one first data value stored in the at least one victim cell and at least one second data value stored in the at least one aggressor cell; and defining edges connecting the function nodes and the variable nodes, wherein the edges are defined to connect the function nodes and the variable nodes based on a relationship of influences of the at least one first data value and the at least one second data value according to a method of programming the plurality of memory cells, wherein the method further comprises determining the at least one first data value and the at least one second data value by applying a message passing algorithm to the element graph, and wherein the message passing algorithm is one of a sum-product algorithm, a min-sum algorithm, a Bahl, Cocke, Jelinek and Raviv (BCJR) algorithm, or a belief propagation algorithm.

2. The method of claim 1, wherein the message passing algorithm comprises:
calculating a plurality of message values based on the element graph; and
determining a first metric with regard to the at least one first data value and a second metric with regard to the at least one second data value based on the plurality of message values.

3. The method of claim 2, further comprising:
determining the at least one data value stored in the at least one victim cell by comparing values of the first metric; and
determining the at least one second data value stored in the at least one aggressor cell by comparing values of the second metric.

4. The method of claim 1, wherein the first physical characteristic is a first threshold voltage, and the second physical characteristic is a second threshold voltage, and
wherein the element graph comprises:
a first function node corresponding to a first probability density function of the first threshold voltage;
a second function node corresponding to a second probability density function of the second threshold voltage;
a first variable node corresponding to the at least one first data value;
a second variable node corresponding to the at least one second data value;
a first edge connecting the first function node and the first variable node;
a second edge connecting the second function node and the second variable node; and
a third edge connecting the first function node and the second variable node.

5. The method of claim 4, further comprising:
providing a first message from the first function node to the first variable node, a second message from the first function node to the second variable node, and a third message from the second function node to the second variable node;
providing a fourth message from the first variable node to the first function node, a fifth message from the second variable node to the first function node, and a sixth message from the second variable node to the second function node; and
determining a first metric with regard to the at least one first data value and determining a second metric with regard to the at least one second data value based on the first through sixth messages.

6. The method of claim 5, further comprising:
determining the at least one first data value stored in the at least one victim cell by comparing message values of the first metric; and
determining the at least one second data value stored in the at least one aggressor cell by comparing message values of the second metric.

7. A method of reading data of a plurality of memory cells, comprising at least one victim cell and at least one aggressor cell, the method comprising:
sensing a physical characteristic of the at least one aggressor cell;
sensing a physical characteristic of the at least one victim cell; and
determining a data value of the at least one aggressor cell based on the physical characteristic of the at least one aggressor cell and the physical characteristic of the at least one victim cell,
wherein determining the data value of the at least one aggressor cell comprises comparing the physical characteristic of the at least one aggressor cell with a reference value, and
wherein determining the data value of the at least one aggressor cell comprises:
determining a data value of the at least one victim cell by comparing the physical characteristic of the at least one victim cell with the reference value; and
determining the data value of the at least one aggressor cell based on a statistics distribution of the data value of the at least one victim cell.

8. The method of claim 7, wherein determining the data value of the at least one aggressor cell is based on the statistics distribution of the data value of the at least one victim cell according to the physical characteristic of the at least one victim cell.

9. The method of claim 8, wherein the data value of the at least one aggressor cell is determined based on the statistics distribution of data values according to the physical characteristic of the at least one victim cell when the physical characteristic of the at least one aggressor cell is within an error range of the reference value.

10. The method of claim 8, wherein the plurality of memory cells comprising the at least one victim cell and the at least one aggressor cell have a first statistics distribution when the data value is a first value (1), and have a second statistics distribution when the data value is a second value (0),
wherein determining the data value of the at least one aggressor cell based on the statistics distribution of the data value of the at least one victim cell comprises:
when the data value of the at least one victim cell is the first value (1), determining the data value of the at least one aggressor cell as the second value (0) as a degree of the physical characteristic of the at least one victim cell apart from an average of the first statistics distribution to the reference value becomes greater; and
when the data value of the at least one victim cell is the second value (0), determining the data value of the at least one aggressor cell as the first value (1) as a degree of the physical characteristic of the at least one victim cell apart from an average of the second statistics distribution to the reference value becomes greater.

11. A memory device, comprising:
a storage unit comprising a memory cell array having a plurality of memory cells, including a victim cell and an aggressor cell adjacent the victim cell in a cell string, wherein a threshold voltage of the victim cell varies due to the aggressor cell; and
a control unit configured to control storage of data in the plurality of memory cells in the storage unit by presenting a relationship between data stored in the victim and aggressor cells and physical characteristics indicating the victim and aggressor cells in an element graph, and reading the data stored in the victim and aggressor cells by applying a message passing algorithm to the element graph,
wherein presenting the relationship between the stored data and the physical characteristics in the element graph comprises:

defining functional nodes corresponding to probability density functions of a first physical characteristic of the victim cell and a second physical characteristic of the aggressor cell;

defining variable nodes corresponding to a first data value stored in the victim cell and a second data value stored in the aggressor cell; and defining edges connecting the function nodes and the variable nodes;

wherein the edges are defined to connect the function nodes and the variable nodes based on a relationship of influences of the at least one first data value and the at least one second data value according to a method of programming the plurality of memory cells, wherein the control unit is further configured to determine the at least one first data value and the at least one second data value by applying a message passing algorithm to the element graph, and wherein the message passing algorithm is one of a sum-product algorithm, a min-sum algorithm, a Bahl, Cocke, Jelinek and Raviv (BCJR) algorithm, or a belief propagation algorithm.

12. The memory device of claim 11, wherein the method of programming the plurality of memory cells comprises one of a single level cell (SLC) programming method, for storing one data value in each of the plurality of memory cells, or a multi level cell (MLC) programming method, for storing more than one data value in each of the plurality of memory cells.

13. The memory device of claim 11, wherein reading the data stored in the victim and aggressor cells by applying the message passing algorithm to the element graph comprises:

deriving a plurality of message values based on the element graph;

determining a first metric with respect to the first data value and a second metric with respect to a second data value based on the plurality of message values;

determining the first data value based on a comparison of values of the first metric; and determining the second data value based on a comparison of values of the second metric.

14. The memory device of claim 13, wherein the first data value is a data value corresponding to a larger value of the first metric determined by the comparison of values of the first metric, and the second data value is a data value corresponding to a larger value of the second metric determined by the comparison of values of the second metric.

* * * * *